United States Patent [19]

Omura et al.

[11] Patent Number: 5,530,667
[45] Date of Patent: Jun. 25, 1996

[54] FERROELECTRIC MEMORY DEVICE

[75] Inventors: Masayoshi Omura, Saitama-ken; Yoshihiro Ishibashi, Nagoya, both of Japan

[73] Assignee: Olympus Optical Co., Ltd., Tokyo, Japan

[21] Appl. No.: 315,193

[22] Filed: Sep. 29, 1994

Related U.S. Application Data

[63] Continuation-in-part of Ser. No. 838,557, Feb. 19, 1992.

[30] Foreign Application Priority Data

Mar. 1, 1991 [JP] Japan .................................. 3-036329
Sep. 24, 1991 [JP] Japan .................................. 3-243464

[51] Int. Cl.$^6$ ............................................. G11C 11/22
[52] U.S. Cl. ........................... 365/145; 365/141; 257/295
[58] Field of Search ..................... 365/145, 189.01, 365/149, 154; 257/295

[56] References Cited

U.S. PATENT DOCUMENTS

| | | | |
|---|---|---|---|
| 4,360,896 | 11/1982 | Brody | 365/145 |
| 5,060,191 | 10/1991 | Nagasaki et al. | 365/145 |
| 5,099,305 | 3/1992 | Takenaka | 365/145 |
| 5,151,877 | 9/1992 | Brennan | 365/189.01 |

FOREIGN PATENT DOCUMENTS 0105792  5/1986  Japan .................................. 365/145

OTHER PUBLICATIONS

"The Physics of Ferroelectric Memories"; Scott et al, Mol Electron; pp. 206–214 (1987).

Journal of the Physical Society of Japan, vol. 54, No. 1, Jan. 1985; pp. 2–3–210, K. Aizu; "Thermodynamical Theory of Equisymmetric Ferroic-to Ferroic Transitions".

*Primary Examiner*—David C. Nelms
*Assistant Examiner*—Son Dinh
*Attorney, Agent, or Firm*—Frishauf, Holtz, Goodman, Langer & Chick

[57] ABSTRACT

A ferroelectric memory device according to the present invention includes memory cells. Each memory cell is constructed such that a lower electrode is formed on a silicon substrate, a ferroelectric capacitor having a hysteresis characteristic with at least two non-linear characteristic portions is formed on the lower electrode, and an upper electrode is formed on the ferroelectric capacitor. The memory cells are arranged in a matrix and are provided with a column switching controller and a row switching controller. These controllers are connected via a switching circuit to a write circuit, a read circuit and a detector. When a voltage lower than a coercive voltage is applied to the memory cells, the data storage states of the memory cells are discriminated on the basis of the difference in differential dielectric constants between "1" and "0", thus reading out the data in a non-destructive manner. In the ferroelectric memory device with this structure, an asymmetrical amplitude waveform voltage of a positive voltage lower than a coercive voltage and a negative voltage of an amplitude smaller than the amplitude of the positive voltage is applied to the ferroelectric film on which data is recorded, thereby reading out the data in a non-destructive manner.

31 Claims, 8 Drawing Sheets

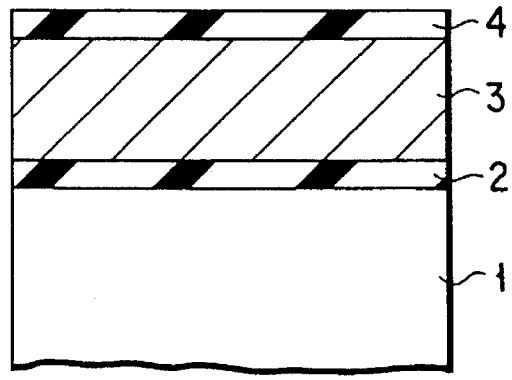
F I G. 1
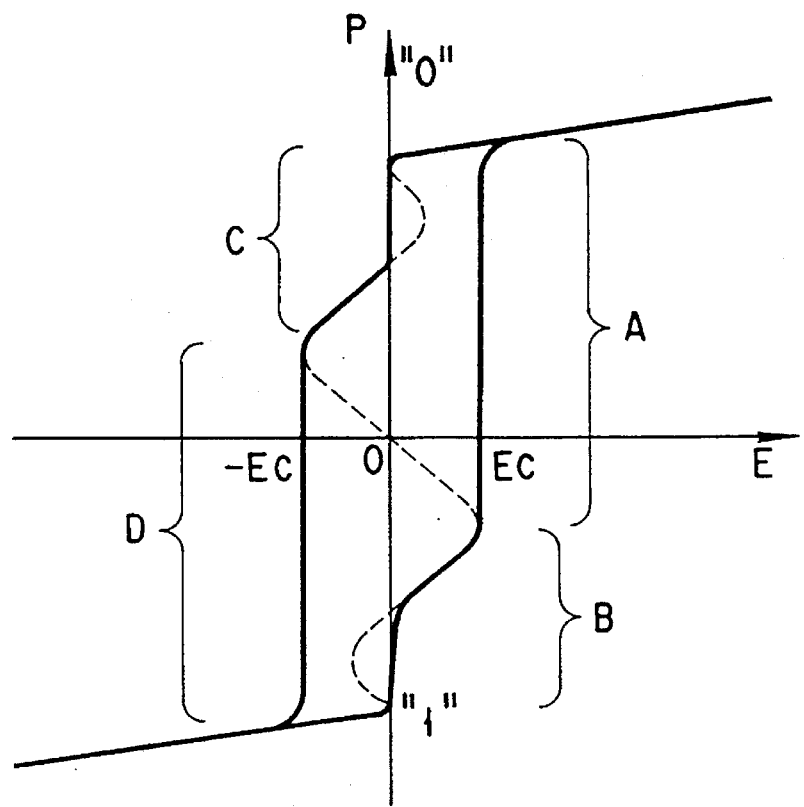
F I G. 2

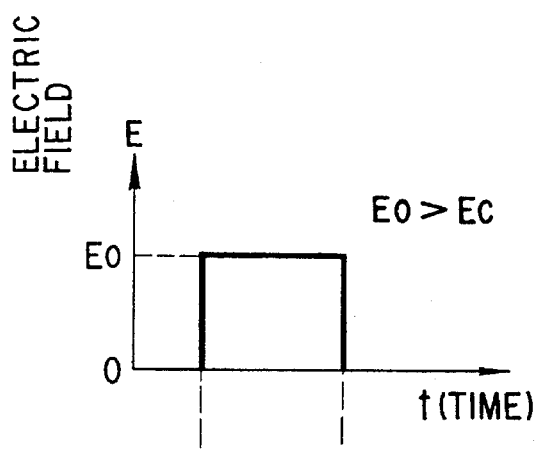
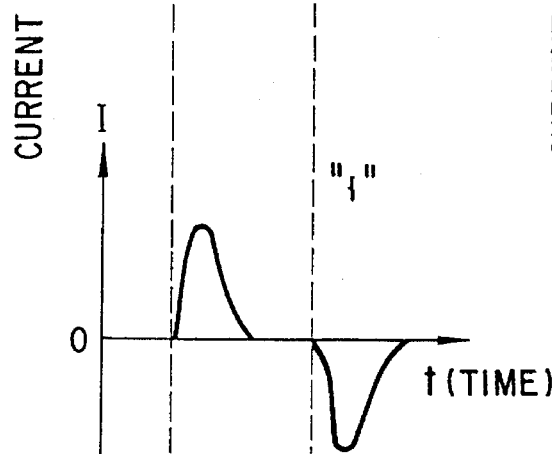
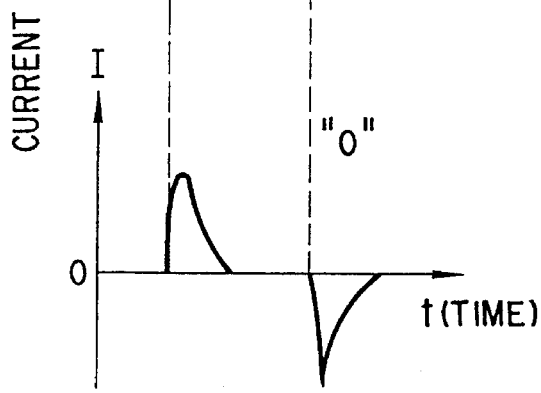
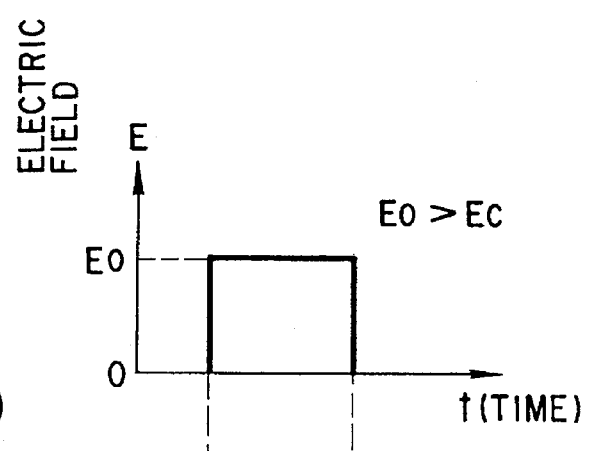
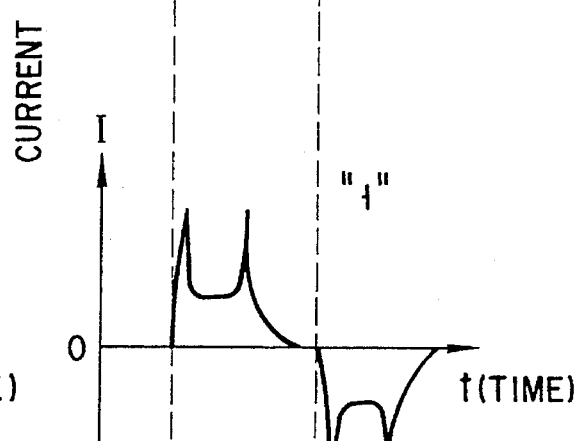
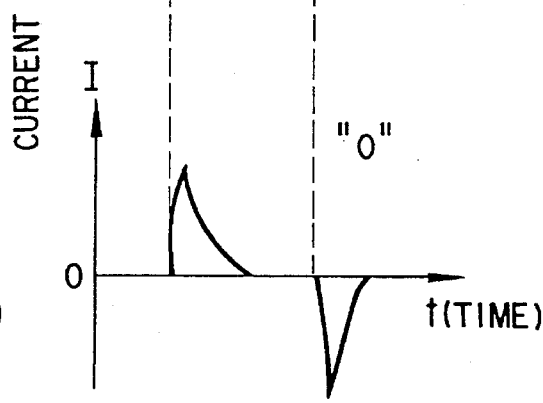
F I G. 3A    F I G. 3B

FERROELECTRIC MEMORY DEVICE

This application is a Continuation-In-Part, of application Ser. No. 07/838,557, filed Feb. 19, 1992.

BACKGROUND OF THE INVENTION

1. Field of the Invention

The present invention relates to a ferroelectric memory capable of non-destructive read-out, wherein a ferroelectric material is employed as information recording medium.

2. Description of the Related Art

In general, a ferroelectric material has a hysteresis characteristic and is employed in a ferroelectric memory device, etc. for storing data by utilizing the hysteresis characteristic.

FIG. 10A is a graph showing a P-V curve of a hysteresis characteristic of a general ferroelectric material, in which the abscissa indicates a voltage V and the ordinate a polarization P. FIG. 10B is a graph showing a C-V curve (obtained by differentiating the P-V curve with the voltage V), in which the abscissa indicates a voltage V and the ordinate a capacitance C. In these drawings, "+VC" and "–VC" indicate a voltage (hereinafter called "coercive voltage") by which directions of polarization are reversed.

As shown in FIG. 10A, the hysteresis characteristic curve of a general ferroelectric material includes one nonlinear portion in a steep rising region A (V>0) and one non-linear portion in a steep descending region B (V<0).

In FIG. 10A, when a voltage V is "0", there are two states of polarization, and the two states are made to correspond to "1" and "0" of digital signals. When these states are read out, a voltage higher than that of the resistant electric field is applied to a selected memory cell in a specific direction. When the direction of this voltage application coincides with the direction of voltage application at the time of write, only a slight displacement current flows. By contrast, if the direction of voltage application differs from that at the time of write, polarization reverse occurs and a large current flows. On the basis of different current values, "1" and "0" are discriminated. In a conventional destructive read-out technique, the hysteresis characteristic shown in FIG. 10 is employed.

There are generally two device structures of the ferroelectric memory utilizing the hysteresis characteristic. One structure is a simple matrix structure, wherein an intersection of stripe electrodes situated at right angles with each other on both surfaces of a ferroelectric thin film is employed as one memory cell. This structure is simple and suitable for high density. The other structure is an active matrix structure wherein one ferroelectric cell is provided with one switch element. This structure is complex and not suitable for high density.

The method of reading out data from these ferroelectric memories is a destructive read-out method utilizing a polarization reverse current, this method requiring rewrite of data in a selected cell.

These ferroelectric memories are disclosed in U.S. Ser. No. 373,082, now U.S. Pat. No. 5,060,191. This document teaches a ferroelectric memory of a simple matrix structure wherein data write/read is performed while the influence of self-reverse phenomenon a phenomenon in which the initial polarization state is restored upon application of external pulses of a ferroelectric thin film itself on a non-selected cell is suppressed by low-impedance write and read.

The above-described ferroelectric memory device, however, has the following problems.

First, when data in a selected memory cell is read out, the data of the selected cell itself is destroyed since a read-out voltage is higher than a coercive voltage. In order to retain the data, rewrite must be performed after read-out, and a complex circuit is required to rewrite data.

Secondly, according to the destructive read-out method, polarization reverse is repeated each time data write/read is carried out. Thus, ferroelectricity is degraded and residual polarization is decreased. That is, there is a problem of fatigue in increasing the life of the memory.

Thirdly, there is a problem of crosstalk between a plurality of memory cells arranged in a matrix so as to increase integration density and memory capacity of non-volatile memories. That is, when a voltage higher than a coercive voltage is applied to a selected memory cell, a voltage exceeding a coercive voltage due to crosstalk may also be applied to an adjacent memory cell and destroy the data in this memory.

Lastly, regarding the write/read method for a simple matrix memory disclosed in the aforementioned U.S. Ser. No. 373,082 (now U.S. Pat. No. 5,060,191) a specific mechanism and device structure in relation to spontaneous reverse phenomenon of spontaneous polarization have not been completed in practical stages.

SUMMARY OF THE INVENTION

The object of the present invention is to provide a ferroelectric memory capable of non-destructive read-out, having a long life, and being suitable for integration.

According to one aspect of the invention, there is provided a ferroelectric memory device comprising: a first electrode of an electrically conductive film formed on a substrate; a ferroelectric film, formed on the first electrode, having a hysteresis characteristic having at least two non-linear characteristic portions; a second electrode of an electrically conductive film formed on the ferroelectric film; data write means for applying a voltage greater than a coercive voltage to the ferroelectric film, thereby writing data to be stored; and data read means for applying a voltage lower than the coercive voltage to the ferroelectric film on which the data has been written, discriminating the storage state on the basis of a resultant difference in differential dielectric constant, thereby reading out the data in a non-destructive manner.

According to another aspect of the invention, there is provided a ferroelectric memory comprising: a first electrode of an electrically conductive film formed on a semi-conductor substrate; a ferroelectric film, formed on the first electrode, having a hysteresis characteristic having at least two non-linear characteristic portions; a second electrode of an electrically conductive film formed on the ferroelectric film; and read means for applying an asymmetrical amplitude waveform voltage of a positive voltage lower than a coercive voltage and a negative voltage of an amplitude smaller than the amplitude of the positive voltage to the ferroelectric film on which data is recorded, thereby reading out the data in a non-destructive manner.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 shows schematically the structure of a ferroelectric memory device according to a first embodiment of the present invention;

FIGS. 3A and 3B are graphs showing the electric field/time characteristics of the ferroelectric memory device of the first embodiment in the case of destructive read-out, and waveforms of current responses;

DETAILED DESCRIPTION OF THE PREFERRED EMBODIMENTS

Embodiments of the present invention will now be described in detail with reference to the accompanying drawings.

FIG. 1 shows the structure of a ferroelectric memory device according to a first embodiment of the present invention. As is shown in FIG. 1, a lower electrode 2 is formed on a silicon substrate 1 on which semiconductor devices and wires have already been formed. A ferroelectric capacitor 3 is formed on the lower electrode 2, and an upper electrode 4 is formed on the ferroelectric capacitor 3. In other words, the ferroelectric capacitor 3 is interposed between the upper and lower electrodes.

The ferroelectric capacitor 3 is formed, by a solution method, of $(NH_4)_3H(SO_4)_2$, $SnCl_2.2H_2O$, $CaPb(C_2H_5COO)_6$, SmS, $Mg(ClO_4)_2.6H_2O$, etc. The capacitor 3 is employed at temperatures below and near the transition temperature of the ferroelectric substance to a paraelectric phase, i.e. Curie temperature.

In this solution method, for example, a ferroelectric capacitor of $(NH_4)_3H(SO_4)_2$ is formed in the following manner. A water solution of 3 moles of $(NH_4)_3SO_4$ and 1 mole of $H_2SO_4$ is attached as a sample on a substrate. The water solution is evaporated at low rate. The obtained single crystal film of $(NH_4)_3H(SO_4)_2$ is a transparent thin film formed in a direction perpendicular to the interface of the substrate, i.e. a direction perpendicular to the (001) plane in the case of a silicon substrate.

Figure 5A:
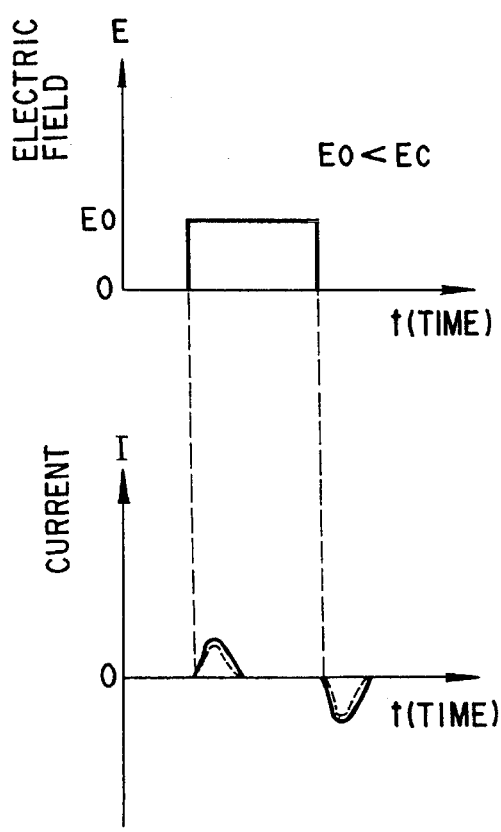
FIG. 5A shows a current response by a ferroelectric capacitor having a conventional hysteresis characteristic.
Figure 5B:
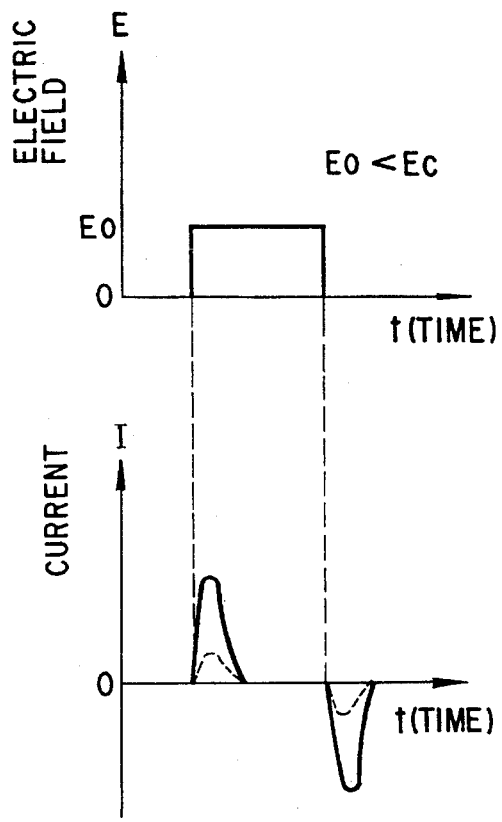
FIG. 5B shows a current response by a ferroelectric capacitor having a hysteresis characteristic of the present invention.

The ferroelectric memory device thus obtained has a hysteresis characteristic as shown in FIG. 5B, as will be described later. The lower electrode 2 and upper electrode 4 are formed by sputtering or depositing Pt, Al, Cu, Ag, Au, etc., and patterning the sputtered or deposited layers by means of ion milling.

Figure 2A:
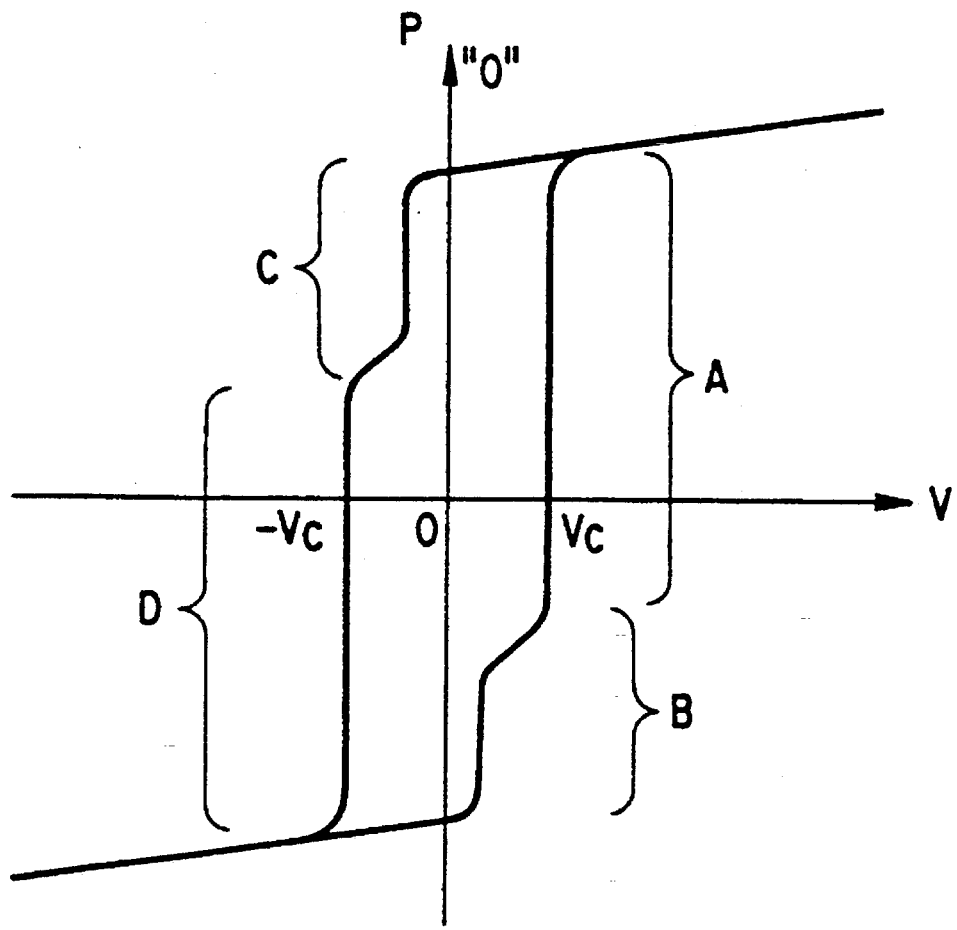
FIG. 2A and 2B show, respectively, a P-V curve and a C-V curve of a hysteresis characteristic of a ferroelectric capacitor included in the ferroelectric memory device of the first embodiment.
Figure 2B:
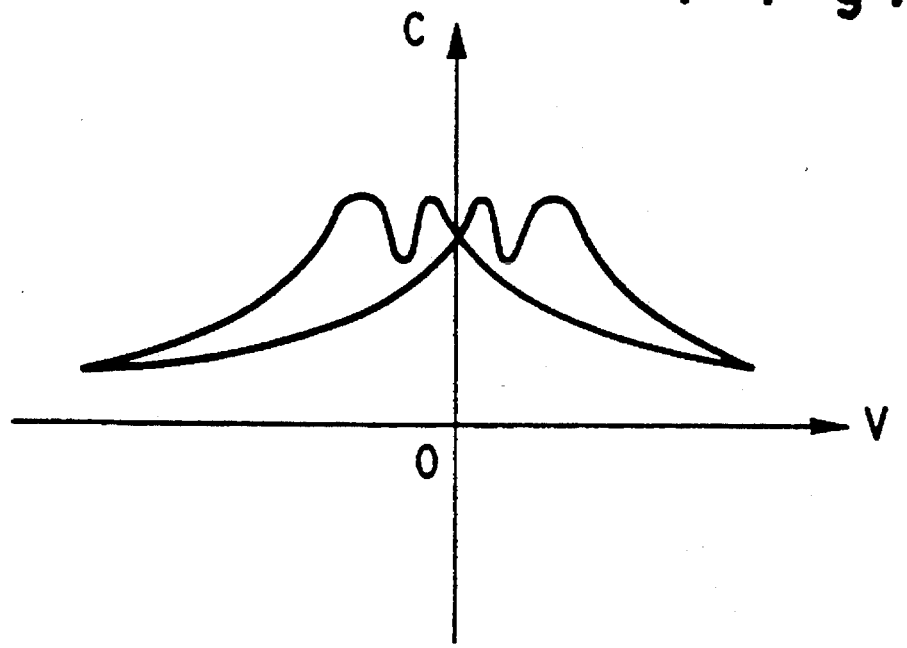

The drawings of FIGS. 2A and 2B show a hysteresis characteristic of a thusly constructed ferroelectric capacitor. FIG. 2A is a graph showing a P-V curve of a hysteresis characteristic, in which the abscissa indicates a voltage V and the ordinate a polarization P. FIG. 2B is a graph showing a C-V curve (obtained by differentiating the P-V curve with the voltage V), in which the abscissa indicates a voltage V and the ordinate a capacitance C.

As shown in FIG. 2A, the hysteresis characteristic curve of the ferroelectric material includes non-linear portions in two steep rising regions A and B and non-linear portions in two steep descending regions C and D. The C-V curve in FIG. 2B shows the hysteresis characteristic having at least two peaks in a positive or negative voltage portion.

Figure 10:
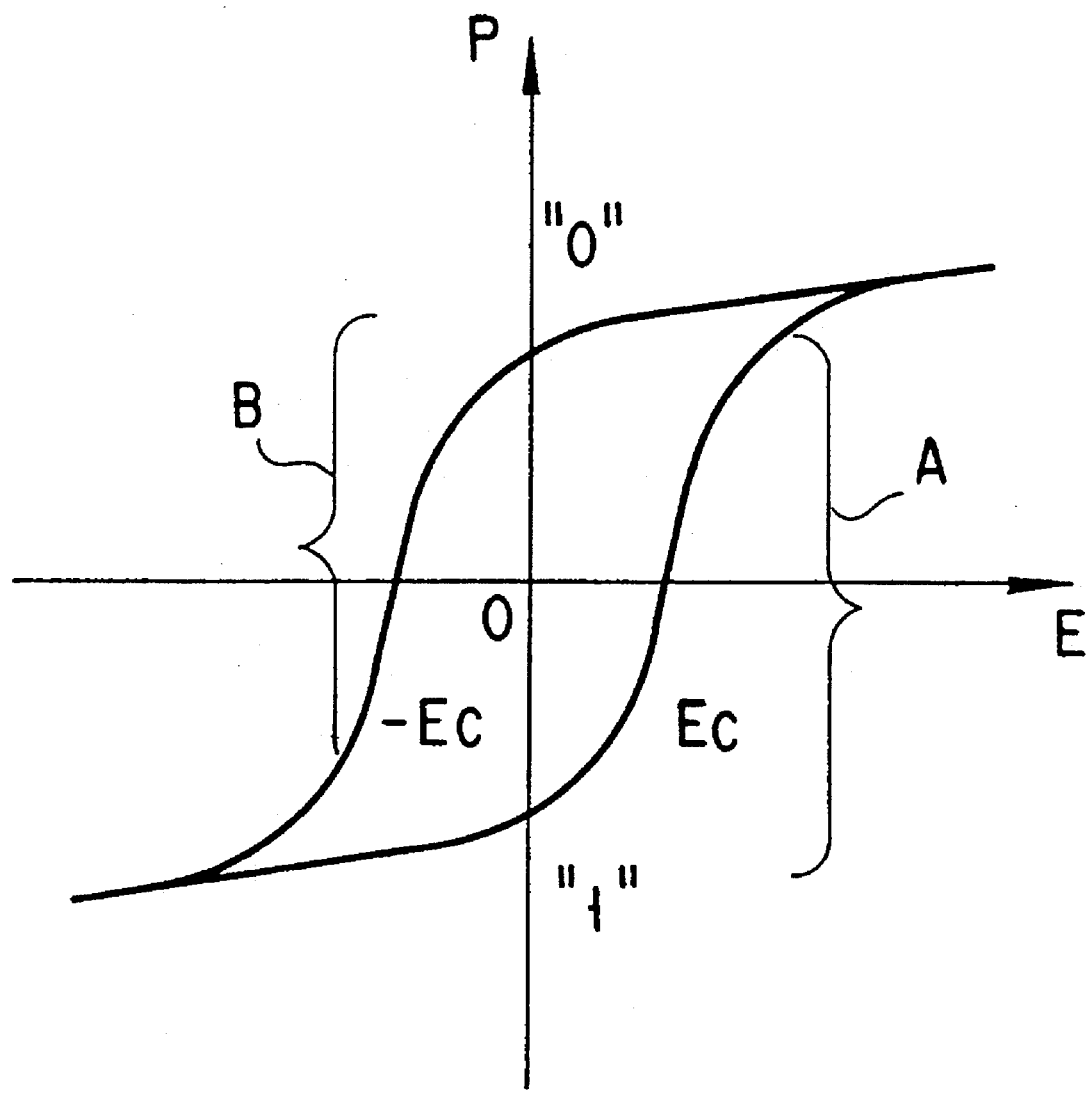
FIGS. 10A and 10B show, respectively, a P-V curve and a C-V curve of a hysteresis characteristic of a conventional ferroelectric material.
Figure 10A:
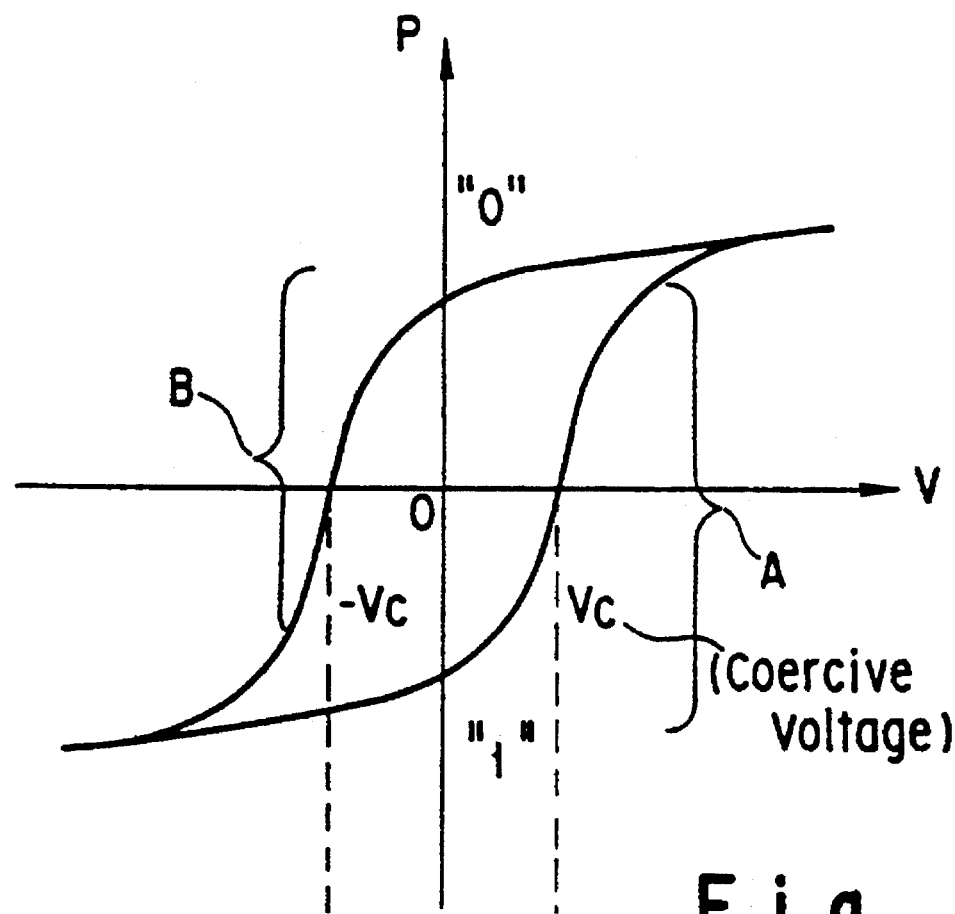
Figure 10B:
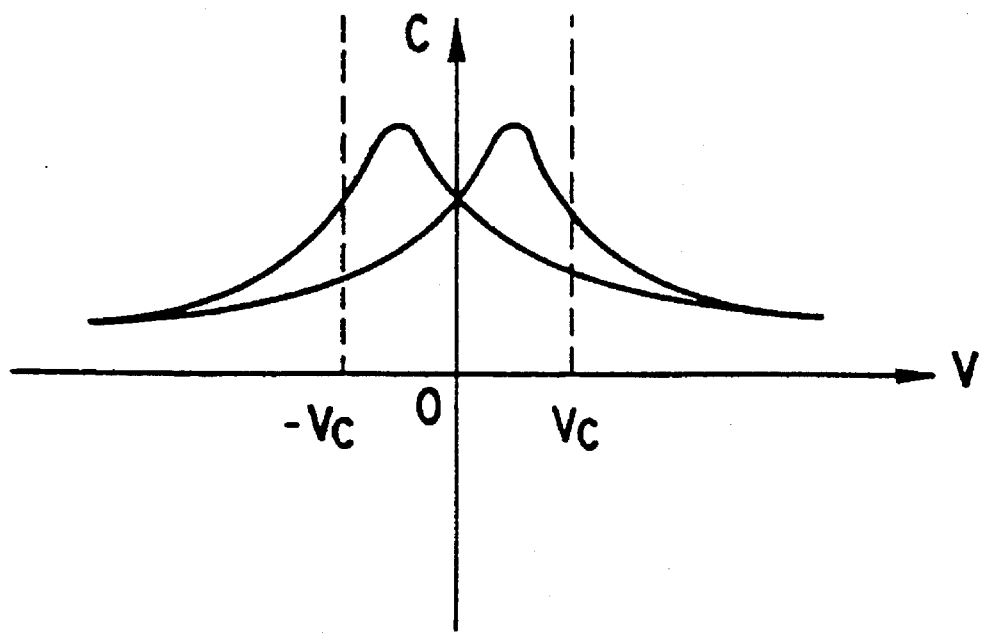

In other words, the ferroelectric material used in this embodiment, unlike the conventional ferroelectric material as shown in FIGS. 10A and 10B, has a hysteresis characteristic having non-linear portions in two steep rising/descending regions which look like a twisted steep rising/descending region in the P-V curve. Thus, the hysteresis characteristic seems to have a plurality of squares. In the C-V curve, the hysteresis characteristic has at least two peaks in a positive or negative voltage portion. The ferroelectric thin film having this hysteresis characteristic is supplied with a voltage greater than a coercive voltage by a write drive circuit (described later) so as to sufficiently obtain polarization. A residual polarization in the same direction as the polarity of voltage is stored in a ferroelectric capacitor of the memory cell. Then, each memory cell, in which data write has been completed, is supplied with a voltage less than a coercive voltage by a read-out drive circuit (described later). Depending on the memory state "1" or "0", a differential dielectric constant dp/de (inclination of hysteresis characteristic) in relation to a low voltage varies.

Specifically, by utilizing a difference in output current based on a magnitude of variation of capacity value, the state "1" or "0" is discriminated to read data. As is shown in FIG. 5B, in the read-out of a low voltage, the stored data can be read out without being lost, and non-destructive read-out can be performed. Compared to the prior art, a complex circuit for rewriting is not required, and degradation due to fatigue is less. Thus, a long-life, high-performance ferroelectric memory can be obtained.

The operation of reading out data from the ferroelectric capacitor having the hysteresis characteristic of FIG. 2 in a destructive manner will now be described.

Data is written in a memory cell having the above hysteresis characteristic by a voltage greater than a coercive voltage. In order to read out data from the memory cell, a voltage lower than the coercive voltage is applied. In the case of the memory state "1" in FIG. 2, one current peak is added due to polarization reverse, as shown in FIG. 3B, compared to the prior art as shown in FIG. 3A. FIGS. 3A and 3B are graphs showing the electric field/time characteristics of the ferroelectric memory device of the first embodiment in the case of destructive readout, and waveforms of current responses. In the memory state "0", however, the characteristic is unchanged.

Since the current responses differ clearly between "1" and "0", data read-out can be performed more desirably than in the prior art. It is theoretically understood, from the study of thermodynamic phenomena, that the hysteresis which is different from that of FIG. 2 but is stable is obtained. Where free energy is "f", $$f = \frac{\alpha}{2} p^2 + \frac{\beta}{4} p^4 + \frac{\gamma}{6} p^6 + \frac{\delta}{8} p^8 - pe \quad (1)$$

where $\alpha$ is a function of temperature, i.e. $\alpha = a(T-T_0)$ (a>0), and $T_0$ is a Curie temperature. In the ferroelectric state (T<T0), $\alpha<0$. In addition, P is polarization, and e is the intensity of an externally applied electric field. The condition for thermal equilibrium in equation (1) is $$\frac{\partial f}{\partial p} = 0$$

From the equation of the condition for thermal equilibrium, the intensity of the externally applied electric field is $$e = \alpha P + \beta P^3 + \gamma P^{d\,5} + \delta P^7 \quad (2)$$

The hysteresis characteristic at the time the parameter $\alpha$ (indicating the dependency of ferroelectric substance upon temperatures) is approached to the Curie temperature is calculated, as shown in FIG. 2, from equation (2).

Since $\frac{dp}{de} \approx \epsilon$ (dielectric constant) > 0 dp/de>0 is a stable region and dp/de<0 is an unstable region. The parameters of FIG. 2 are $\alpha=-0.12$ o $-0.25$, $\beta=1$, $\delta=1$, and $\gamma=-1.8$. In this way, by utilizing the dependency of the ferroelectric substance upon the temperature near the Curie temperature, the material having the hysteresis characteristic of FIG. 2 can be obtained.

In the first embodiment, the ferroelectric capacitor was formed by the solution method; however, the method is not limited to this, and growth from a molten liquid or vapor-phase growth may be adopted. Further, a thin-film forming technique such as sputtering or deposition capable of forming a ferroelectric film may be adopted.

Figure 4:
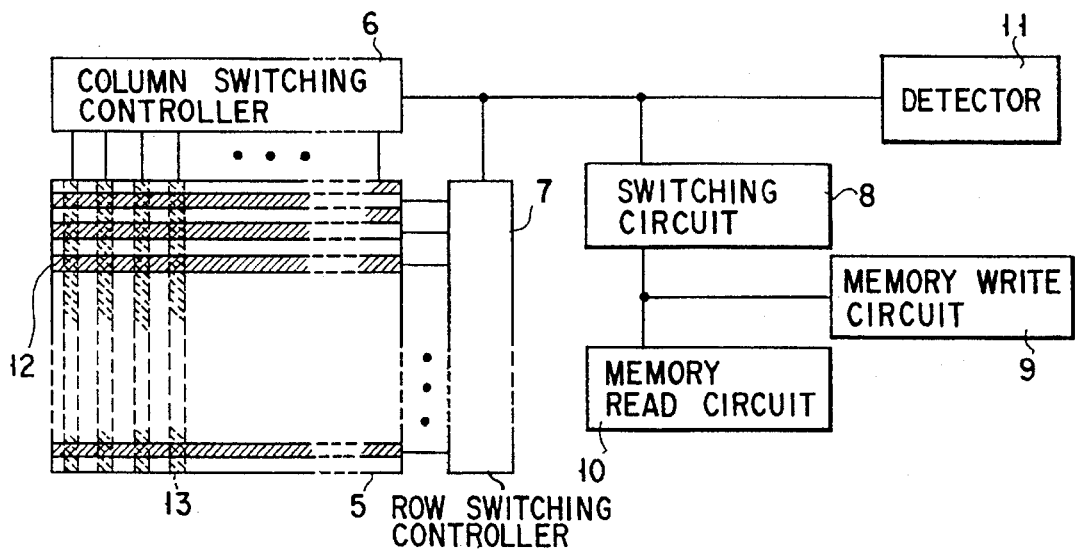
FIG. 4 is a block diagram showing the structure of a matrix memory circuit capable of reading out stored data in a non-destructive manner, according to a second embodiment of the invention, wherein memory cells using the ferroelectric capacitors of the present invention are arranged in a matrix.

FIG. 4 is a block diagram showing the structure of a matrix memory circuit capable of reading out stored data in a non-destructive manner, according to a second embodiment of the invention, wherein memory cells using the ferroelectric capacitors of the present invention are arranged in a matrix.

In this matrix memory circuit, memory cells 5 are arranged in a matrix. Around the memory cells 5, there are provided a column switching controller 6 and a row switching controller 7. The controllers 6 and 7 are connected via a switching circuit 8 to a write circuit 9 and a read circuit 10. Further, a detector 11 is connected to the controllers 6 and 7. The memory cell using the ferroelectric capacitor has the hysteresis characteristic shown in FIG. 2.

As is shown in FIG. 4, in the matrix memory circuit, several stripe electrodes 12 and 13 are formed on the upper and lower surfaces of the matrix memory cells 5 such that the electrodes 12 and 13 intersect at right angles (the upper surface is indicated by solid lines, and the lower surface by broken lines).

Regarding the write operation of the first embodiment and the control circuit (not shown) for controlling the read operation, the description in U.S. Ser. No. 373,082 is referred to.

A voltage greater than a coercive voltage $e_c$ is applied to each cell of the matrix memories 5 by the write circuit 9, column switching controller 6 and row switching controller 7, thus writing the polarization direction in each cell.

After completion of write, the read circuit 10 is set to be operated by the switching circuit 8. The column switching controller 6 and row switching controller 7 apply a voltage lower than the coercive voltage $e_c$ to selected memory cells to read out data. FIG. 5A shows an electric field/current response characteristic with passing of time of the ferroelectrcapacitor having a conventional hysteresis characteristic curve, and FIG. 5B shows an electric field/current response characteristic with passing of time of the ferroelectric capacitor having a hysteresis characteristic curve of the present invention. As shown in FIGS. 5A and 5B, in the memory cells of the present invention, the differential dielectric constants (inclination of hysteresis) in relation to low voltage differ greatly between "1" and "0". Thus, there is a large difference in output current. By discriminating the state of "1" and "0", data can be read out.

As stated above, the stored data can be read out in a non-destructive manner by a read voltage lower than the resistant electric field.

Accordingly, a conventional complex circuit for rewrite data, which is lost by destructive read-out, is not required. In addition, a memory cell, which consumes less electric power, suffers less degradation of performance due to use, and has a longer life, can be obtained.

Since a high S/N of output current can be obtained with a small read voltage, the problem of crosstalk in the matrix memory cells is improved.

As has been described above in detail, in the ferroelectric memory device of the present invention, the difference in output current based on the magnitude in variation of capacity value is utilized, and the "1" state and "0" state are discriminated to read out data. By virtue of the low-voltage data read-out from the ferroelectric memory device, the data is not lost even after the data is read out and the non-destructive read-out can be carried out. Furthermore, compared to the conventional device, the complex circuit for data rewrite is not required, and the long-life, high-performance ferroelectric memory, in which the degradation of performance resulting from fatigue due to use is slight by virtue of low-voltage read-out, can be obtained.

Figure 6:
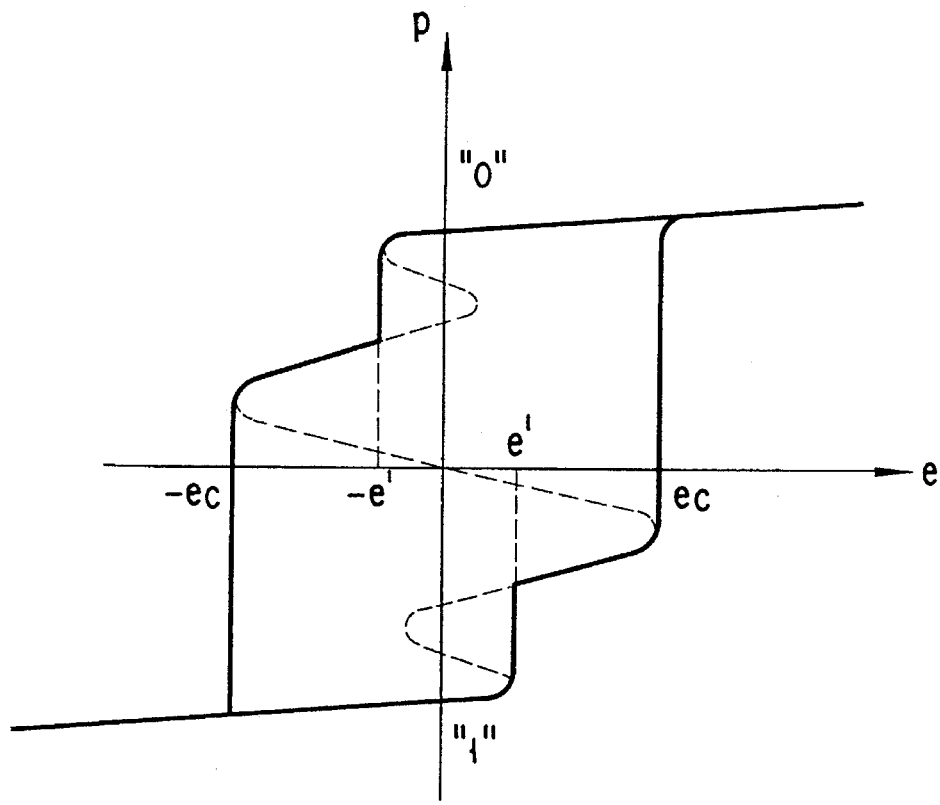
FIG. 6 shows a hysteresis characteristic of a ferroelectric capacitor for constituting a ferroelectric memory, according to a third embodiment of the invention.

FIG. 6 shows a hysteresis characteristic of a ferroelectric capacitor for constituting a ferroelectric memory, according to a third embodiment of the invention.

This hysteresis characteristic can be theoretically obtained on the basis of the study of thermodynamic phenomena. As was described by referring to equations (1) and (2) in connection with the first embodiment, it is confirmed, from the phenomenal analysis of the ferroelectric-ferroelectric phase transition (equal phase transition), that the non-destructive read-out adopted in the present invention is effective. By utilizing the dependency of the ferroelectric substance upon temperatures near the Curie temperature, the hysteresis characteristic of FIG. 6 can be obtained.

The non-destructive data read method of the third embodiment will now be described with reference to FIG. 7.

Figure 7:
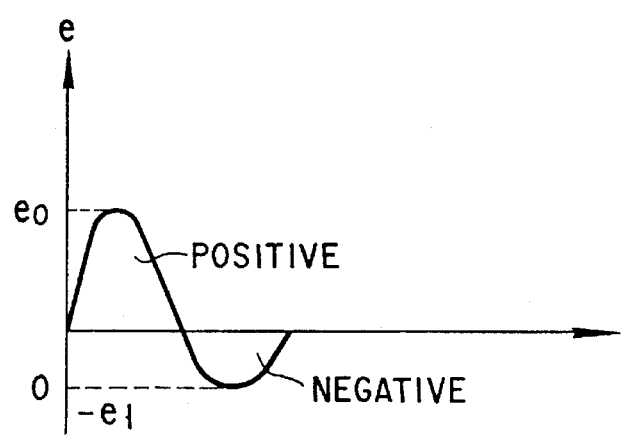
FIG. 7 shows a read-out drive waveform in the ferroelectric memory according to the third embodiment.

FIG. 7 shows a read-out drive waveform. The conditions for the positive/negative drive waveform in the present invention are: the positive amplitude $e_0$ is lower than a coercive voltage $e_c$, and the negative amplitude $e_1$ is lower than the positive amplitude $e_0$ and $e'$ ($e_1=e_0/2<e_0<e_c$). Here, $e_1=e_0/2$, and $e_1<e'$. The drive waveform may be a sine wave, rectangular wave, triangular wave or a combination thereof.

Figure 8A:
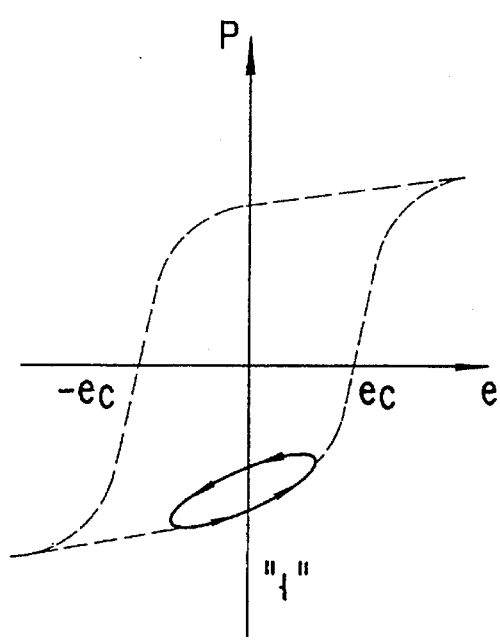
FIG. 8A shows the state in which conventional polarization is changed in the memory state "1"
Figure 8B:
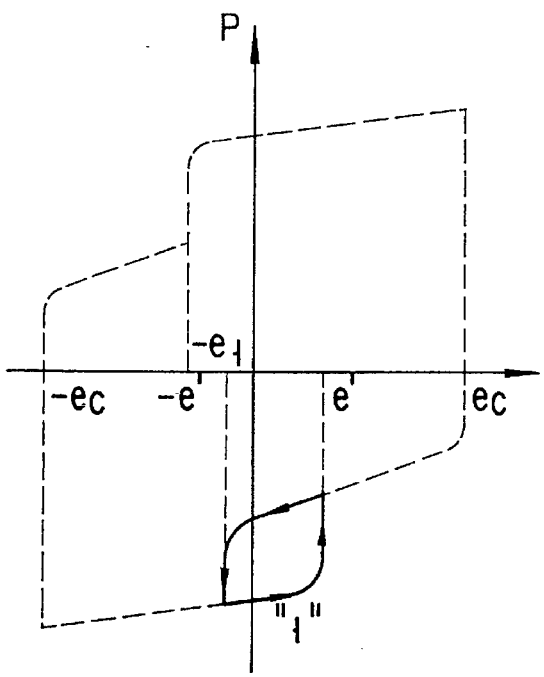
FIG. 8B shows the state (the result of logical analysis) in which polarization according to the third embodiment is changed in the memory state "1"
Figure 9A:
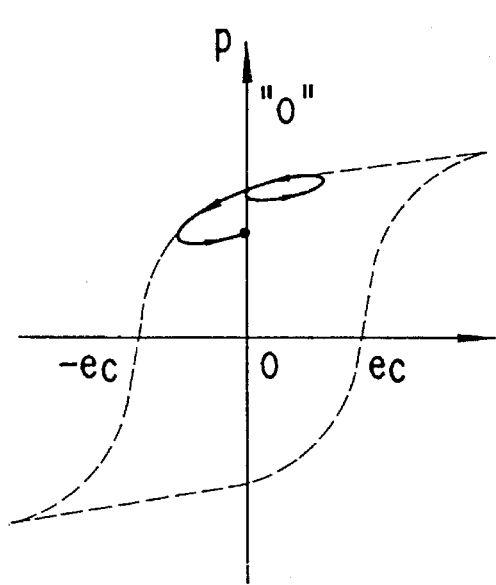
FIG. 9A shows the state in which conventional polarization is changed in the memory state "0"
Figure 9B:
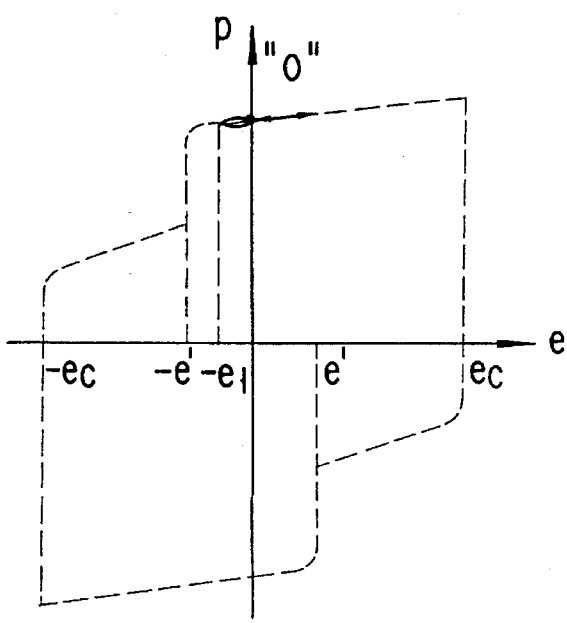
FIG. 9B shows the state (the result of logical analysis) in which polarization according to the third embodiment is changed in the memory state "0"

FIGS. 8 and 9 show the results of theoretical analysis of the present invention. FIGS. 8B and 9B show, in comparison to FIGS. 8A and 9A (prior art), the states of polarization changes occurring when the readout drive waveform signal of FIG. 7 is applied. FIG. 8B is directed to the case of memory state "1", and FIG. 9B to the case of memory state "0". From FIGS. 8B and 9B, it is understood that in this invention no degradation occurs in polarization in the memory state "1" or memory state "0". In the hysteresis characteristic adopted in this invention, the differential dielectric constants (inclination of hysteresis) in relation to low voltage differ greatly between "1" and "0", and there is a large difference in output current. Thus, "1" and "0" can be discriminated to read out data.

Since a high S/N of output current can be obtained with a small voltage, the problem of crosstalk in the matrix memory cells is improved.

As stated above, the stored data can be read out in a non-destructive manner by a read-out voltage lower than the coercive voltage.

According to the ferroelectric memory device with the above structure, utilizing the difference in output current based on the magnitude in variation in capacity value at the time of voltage application, the storage states "1" and "0" are discriminated and data is exactly read out. Specifically, the stored data can be read out in a non-destructive manner from the ferroelectric memory device by application of low read operation voltage, no data is lost, and the circuit for data rewrite is not required.

According to the ferroelectric memory of the present invention, an asymmetrical amplitude waveform voltage of a positive voltage lower than a coercive voltage and a negative voltage of an amplitude smaller than the amplitude of the positive voltage is applied to the ferroelectric film on which data is recorded, thereby reading out the data in a non-destructive manner. The life of the memory can be increased and the integration density is enhanced.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A ferroelectric memory device comprising:

a first electrode of an electrically conductive film formed on a substrate;

a ferroelectric film, formed on the first electrode, having a hysteresis characteristic having at least two different non-linear characteristic portions at regions below and above a coercive voltage;

a second electrode of an electrically conductive film formed on the ferroelectric film;

data write means for applying a voltage greater than the coercive voltage to the ferroelectric film, thereby writing data to be stored by setting a storage state; and data read means for applying a voltage lower than the coercive voltage to the ferroelectric film on which the data has been written, and discriminating the storage state on the basis of a resultant difference in differential dielectric constant, thereby reading out the data in a non-destructive manner.

2. The ferroelectric memory device according to claim 1, comprising:

stripe electrodes arranged to face each other with the ferroelectric memory device interposed;

write drive means for applying a voltage greater than a coercive voltage via the stripe electrodes, thereby writing said data to be stored; and read drive means for applying an adjustable voltage to the coercive voltage, thereby reading out the data in a destructive manner and a non-destructive manner.

3. The ferroelectric memory device according to claim 1, wherein the ferroelectric film is grown from a solution.

4. The ferroelectric memory device according to claim 1, wherein the ferroelectric film is grown from a molten liquid.

5. The ferroelectric memory device according to claim 1, wherein the ferroelectric film is vapor-phase grown.

6. The ferroelectric memory device according to claim 1, wherein said first and second electrodes are formed of any one selected among the group consisting of Pt, Al, Cu, Ag and Au.

7. The ferroelectric memory device according to claim 1, wherein said first and second electrodes are formed by means of any one of sputtering and deposition, and are patterned by a photographical technique.

8. A ferroelectric memory comprising:

a first electrode of an electrically conductive film formed on a semiconductor substrate;

a ferroelectric film, formed on the first electrode, having a hysteresis characteristic having at least two non-linear characteristic portions;

a second electrode of an electrically conductive film formed on the ferroelectric film; and read means for applying an asymmetrical amplitude waveform voltage of a positive voltage lower than a coercive voltage and a negative voltage of an amplitude smaller than the amplitude of the positive voltage to the ferroelectric film on which data is recorded, thereby reading out the data in a non-destructive manner.

9. The ferroelectric memory according to claim 8, wherein in the data read-out said asymmetrical amplitude waveform is at least one of a sine wave, a rectangular wave and a triangular wave.

10. The ferroelectric memory device according to claim 8, comprising:

ferroelectric memory cells arranged in a matrix;

stripe electrodes formed on upper and lower surfaces of said ferroelectric memory cells such that said stripe electrodes intersect one another with said ferroelectric memory cells interposed therebetween;

write drive means for applying a voltage greater than a resistant electric field via the stripe electrodes, thereby writing data to be stored; and read drive means for applying an adjustable voltage to the coercive voltage, thereby reading out the data in a destructive manner and a non-destructive manner.

11. The ferroelectric memory device according to claim 1, wherein said ferroelectric film is formed of a material having a hysteresis characteristic utilizing the dependency upon temperatures near a Curie temperature.

12. The ferroelectric memory device according to claim 8, wherein said ferroelectric film is formed of a material having a hysteresis characteristic utilizing the dependency upon temperatures near a Curie temperature.

13. The ferroelectric memory device according to claim 1, wherein said hysteresis characteristic of said ferroelectric film is formed with a forward path and a return path, each path having at least two non-linear characteristic portions.

14. The ferroelectric memory device according to claim 8, wherein said hysteresis characteristic of said ferroelectric film is formed with a forward path and a return path, each path having at least two non-linear characteristic portions.

15. The ferroelectric memory device according to claim 1, wherein the hysteresis characteristic has at least two peaks in a positive or negative voltage portion when the hysteresis characteristic is represented by a C-V curve.

16. The ferroelectric memory device according to claim 1, wherein the hysteresis characteristic comprises a plurality of squares and has at least two steep rising portions and two descending portions when the hysteresis characteristic is represented by a P-V curve.

17. The ferroelectric memory device according to claim 15, comprising:

stripe electrodes arranged to face each other with the ferroelectric memory device interposed;

write drive means for applying a voltage greater than a coercive voltage via the stripe electrodes, thereby writing said data to be stored, and read drive means for applying an adjustable voltage to the coercive voltage, thereby reading out the data in a destructive manner and a non-destructive manner.

18. The ferroelectric memory device according to claim 15, wherein the ferroelectric film is grown from a solution.

19. The ferroelectric memory device according to claim 15, wherein the ferroelectric film is grown from a molten liquid.

20. The ferroelectric memory device according to claim 15, wherein the ferroelectric film is vapor-phase grown.

21. The ferroelectric memory device according to claim 15, wherein said first and second electrodes are formed of any one selected among the group consisting of Pt, Al, Cu, Ag and Au.

22. The ferroelectric memory device according to claim 15, wherein said first and second electrodes are formed by means of any one of sputtering and deposition, and are patterned by a photographical technique.

23. The ferroelectric memory device according to claim 15, wherein said ferroelectric film is formed of a material having a hysteresis characteristic utilizing the dependency upon temperatures near a Curie temperature.

24. The ferroelectric memory device according to claim 16, comprising:

stripe electrodes arranged to face each other with the ferroelectric memory device interposed;

write drive means for applying a voltage greater than a coercive voltage via the stripe electrodes, thereby writing said data to be stored, and read drive means for applying an adjustable voltage to the coercive voltage, thereby reading out the data in a destructive manner and a non-destructive manner.

25. The ferroelectric memory device according to claim 16, wherein the ferroelectric film is grown from a solution.

26. The ferroelectric memory device according to claim 16, wherein the ferroelectric film is grown from a molten liquid.

27. The ferroelectric memory device according to claim 16, wherein the ferroelectric film is vapor-phase grown.

28. The ferroelectric memory device according to claim 16, wherein said first and second electrodes are formed of any one selected among the group consisting of Pt, Al, Cu, Ag and Au.

29. The ferroelectric memory device according to claim 16, wherein said first and second electrodes are formed by means of any one of sputtering and deposition, and are patterned by a photographical technique.

30. The ferroelectric memory device according to claim 16, wherein said ferroelectric film is formed of a material having a hysteresis characteristic utilizing the dependency upon temperatures near a Curie temperature.

31. The ferroelectric memory device according to claim 16, wherein said hysteresis characteristic of said ferroelectric film is formed with a forward path and a return path, each path having at least two non-linear characteristic portions.

* * * * *